(12) United States Patent
Cox et al.

(10) Patent No.: US 11,114,289 B2
(45) Date of Patent: Sep. 7, 2021

(54) NON-DISAPPEARING ANODE FOR USE WITH DIELECTRIC DEPOSITION

(71) Applicant: Applied Materials, Inc., Santa Clara, CA (US)

(72) Inventors: Michael S. Cox, Gilroy, CA (US); Lara Hawrylchak, Gilroy, CA (US); Brian T. West, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 131 days.

(21) Appl. No.: 15/432,590

(22) Filed: Feb. 14, 2017

(65) Prior Publication Data

US 2017/0316924 A1 Nov. 2, 2017

Related U.S. Application Data

(60) Provisional application No. 62/328,426, filed on Apr. 27, 2016.

(51) Int. Cl.
*H01J 37/34* (2006.01)
*H01J 37/32* (2006.01)
(Continued)

(52) U.S. Cl.
CPC .......... *H01J 37/3441* (2013.01); *C23C 14/34* (2013.01); *C23C 14/564* (2013.01);
(Continued)

(58) Field of Classification Search
CPC ............. H01J 37/3441; H01J 37/32541; H01J 37/32568; H01J 37/3438; H01J 37/32477;
(Continued)

(56) References Cited

U.S. PATENT DOCUMENTS 3,514,391 A * 5/1970 Hablanian ............. C23C 14/355
204/298.06
5,837,057 A * 11/1998 Koyama ................ B41J 2/1642
118/723 VE
(Continued)

FOREIGN PATENT DOCUMENTS

CN 1713334 A 12/2005
CN 1806316 A 7/2006
(Continued)

OTHER PUBLICATIONS

International Search Report and Written Opinion for PCT/US2017/024749 dated Jul. 10, 2017.
(Continued)

*Primary Examiner* — Michael A Band
(74) *Attorney, Agent, or Firm* — Patterson + Sheridan, LLP

(57) ABSTRACT

Embodiments of the invention generally relate to an anode for a semiconductor processing chamber. More specifically, embodiments described herein relate to a process kit including a shield serving as an anode in a physical deposition chamber. The shield has a cylindrical band, the cylindrical band having a top and a bottom, the cylindrical band sized to encircle a sputtering surface of a sputtering target disposed adjacent the top and a substrate support disposed at the bottom, the cylindrical band having an interior surface. A texture is disposed on the interior surface. The texture has a plurality of features. A shaded area is disposed in the feature wherein the shaded area is not visible to the sputtering target. A small anode surface is disposed in the shaded area.

18 Claims, 4 Drawing Sheets

(51) Int. Cl.
    *C23C 14/56*      (2006.01)
    *C23C 14/34*      (2006.01)
    *H01L 21/02*      (2006.01)

(52) U.S. Cl.
    CPC .. *H01J 37/32541* (2013.01); *H01J 37/32568* (2013.01); *H01J 37/3438* (2013.01); *H01L 21/02164* (2013.01); *H01L 21/02266* (2013.01)

(58) Field of Classification Search
    CPC .......... H01J 37/32651; H01J 37/32495; C23C 14/34; C23C 14/564; C23C 16/4585; C23C 14/0068; H01L 21/02164; H01L 21/02266
    See application file for complete search history.

(56) References Cited

U.S. PATENT DOCUMENTS

| | | | |
|---|---|---|---|
| 6,132,566 A | 10/2000 | Hofmann et al. | |
| 6,506,312 B1* | 1/2003 | Bottomfield | C23C 14/564 118/715 |
| 6,572,744 B1* | 6/2003 | Paranjpe | C23C 14/046 204/298.06 |
| 7,762,114 B2* | 7/2010 | Abney | B21D 22/16 72/370.01 |
| 8,833,299 B2* | 9/2014 | Shiina | C23C 14/564 118/723 E |
| 2004/0206804 A1* | 10/2004 | Kim | C23C 14/3407 228/199 |
| 2005/0274910 A1 | 12/2005 | Desai et al. | |
| 2006/0105182 A1 | 5/2006 | Brueckner et al. | |
| 2007/0056688 A1* | 3/2007 | Kim | B24C 1/003 156/293 |
| 2015/0079336 A1 | 3/2015 | Wang et al. | |
| 2015/0129414 A1 | 5/2015 | Bih et al. | |
| 2016/0079040 A1 | 3/2016 | Park et al. | |

FOREIGN PATENT DOCUMENTS

| | | |
|---|---|---|
| CN | 1849409 A | 10/2006 |
| CN | 101787519 A | 7/2010 |
| JP | 2006199989 A | 8/2006 |
| JP | 2013501855 A | 1/2013 |
| WO | 2014210141 A1 | 12/2014 |
| WO | 2015191311 A1 | 12/2015 |

OTHER PUBLICATIONS

Taiwan Office Action dated Mar. 12, 2020 for Application No. 106111974.
European Search Report from EP Patent Application No. 17790063.6 dated Nov. 28, 2019.
Taiwan Office Action dated Sep. 8, 2020 for Application No. 106111974.
Office Action from Japan Patent Application No. 2018545945 dated Feb. 15, 2021.
Office Action from Chinese Patent Application No. 201780025858.5 dated Nov. 6, 2020.
Office Action from Chinese Patent Application No. 201780025858.5 dated Jun. 23, 2020.

* cited by examiner

NON-DISAPPEARING ANODE FOR USE WITH DIELECTRIC DEPOSITION

CROSS-REFERENCE TO RELATED APPLICATIONS

This application claims benefit of U.S. Provisional Application Ser. No. 62/328,426, filed Apr. 27, 2016, of which is incorporated by reference in its entirety.

BACKGROUND OF THE INVENTION

Field of the Invention

Embodiments of the invention apply to the deposition of dielectric films in any chamber utilizing a plasma enhanced process. More specifically embodiments of the invention relate to a processing kit suitable for maintaining an anode in a physical deposition chamber.

Description of the Related Art

Physical vapor deposition (PVD), or sputtering, is one of the most commonly used processes in the fabrication of electronic devices. PVD is a plasma process performed in a vacuum chamber where a negatively biased target is exposed to a plasma, i.e., charged particles, of an inert gas having relatively heavy atoms (e.g., argon (Ar)) or a gas mixture comprising such inert gas. There may additionally be a reactive gas used as well, such as oxygen, nitrogen, etc. that combines with the target material. The plasma is maintained in the chamber by supplying energy (RF, magnetic, electric, . . . ) to the gas mixture. Bombardment of the target by ions of the inert gas results in ejection of atoms of the target material. The ejected atoms accumulate as a deposited film on a substrate placed on a substrate support pedestal disposed within the chamber.

The process kit may act as the anode for the charged particles of the plasma. When dielectric films are deposited in PVD chambers the films, a dielectric layer is deposited on the process kit as well as the substrate. The dielectric layer deposited on the process kit negatively affects the properties of the plasma causing a process drift relative to an uncoated anode. Drift in plasma properties, primarily voltage, negatively affects the deposited film on the substrate and therefore the quality and performance of the devices formed on the substrate. Additionally, when the plasma voltage rises sufficiently, the plasma will discharge through arcing which will either create a hole through the dielectric material deposited on the process kit or the substrate, causing contamination and/or damage to the substrate. If the plasma does not arc in the upper portion of the chamber, the arc can occur under the substrate support or pedestal in the lower portion of the chamber area bleeding off and destabilizing the plasma, again negatively affecting the deposited film quality.

Previous solutions required frequent changing of the process kit which negatively impacts chamber availability and process stability while doing nothing to eliminate the process drift caused by the plasma voltage drift as the kits become coated.

Therefore, there is a need for improving the performance of the anode.

SUMMARY OF THE INVENTION

Embodiments of the invention generally relate to an anode for a semiconductor processing chamber. More specifically, embodiments described herein relate to a process kit for a plasma processing chamber, and physical vapor deposition chamber having the same are described therein. In one example, a process kit for a plasma processing chamber includes a conductive body having orientation when the body is in use in the processing chamber that defines a top of the body and a vertical centerline. The body has an array of features formed in a surface of the body that is exposed to a plasma when in use in the processing chamber. The features have a profile and an opening in the surface. The profile has a geometric centerline extending away from the top of the body through the opening. The geometric centerline forms an obtuse angle with the vertical centerline of the body.

In another embodiment, process kit for a RF physical vapor deposition (RFPVD) chamber is provided that includes a conductive body. The body has an orientation when the process kit is in use in the RFPVD chamber that defines a top of the body and a vertical centerline. The body has an array of features formed in a substantially vertical surface of the body that is exposed to a plasma when the process kit in use in the RFPVD chamber. The features have a profile and an opening in the surface. A greater portion of the profile resides above an imaginary line extending perpendicularly through the vertical centerline and an edge of the opening closest the top of the body.

In yet another embodiment, a physical vapor deposition (PVD) chamber is provided. The PVD chamber includes a chamber body defining in interior volume, a substrate support disposed in the interior volume, a sputtering target disposed in the interior volume above the substrate support, and a process kit disposed in the interior volume between the substrate support and sputtering target. The process kit includes conductive body having a vertical centerline. The body has an array of features formed in a surface of the body that is exposed to a plasma when in use in the PVD chamber. The features have a profile and an opening in the surface. The profile has a geometric centerline extending away from the target through the opening. The geometric centerline forms an obtuse angle with the vertical centerline of the body.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally provide a process kit for use in a physical deposition chamber (PVD) chamber. In one embodiment, the process kit provides an anode that is configured to substantially prevent complete coating by the deposited material when in use, this maintaining a robust return path contributing to greater process uniformity and repeatability along with longer chamber component, i.e., process kit, service life.

Directional surface shapes or textures may be disposed on the interior surface of a chamber anode, such as the upper shield, which create shadowed areas. Shadowed areas are defined as areas of the feature that are shielded from straight line exposure to a target positioned vertically above the anode. The shadowed areas in the surface shapes are substantially blocked from deposition materials accumulating therein. The shadowed areas prevent deposited material from insulating and isolating the chamber anode and interrupting the electrical ground path for the plasma. The surface shapes can be machined into the part surfaces, i.e., the anode, etched through mechanical or chemical erosion, formed through laser or electron beam surface modification, 3D printing, or formed through other suitable techniques. Since deposition does not occur or the deposition is sufficiently thin in the shadowed areas the DC and/or RF return path is maintained through many deposition cycles, thus providing process stability and extending the service life of the chamber components, such as the process kit.

In one embodiment, the directional surface shape or feature may be in the form of a surface modification. The surface modification has a shadowed area which ensures the plasma a viable ground return path is maintained. Where sufficient depth of the deposit film blocks most of the entrances to the surface modifications, the ground return remains viable due to the shadowed areas remaining substantially free from the deposited films. The film thickness on the process kit may be monitored to prevent particle shedding. Thus, the surface modifications, and in particular, the shadow areas, yield a longer kit life for dielectric deposition films while enabling enhanced stability of the plasma and reducing, or eliminating, the potential for dielectric film related arcing.

Figure 1:
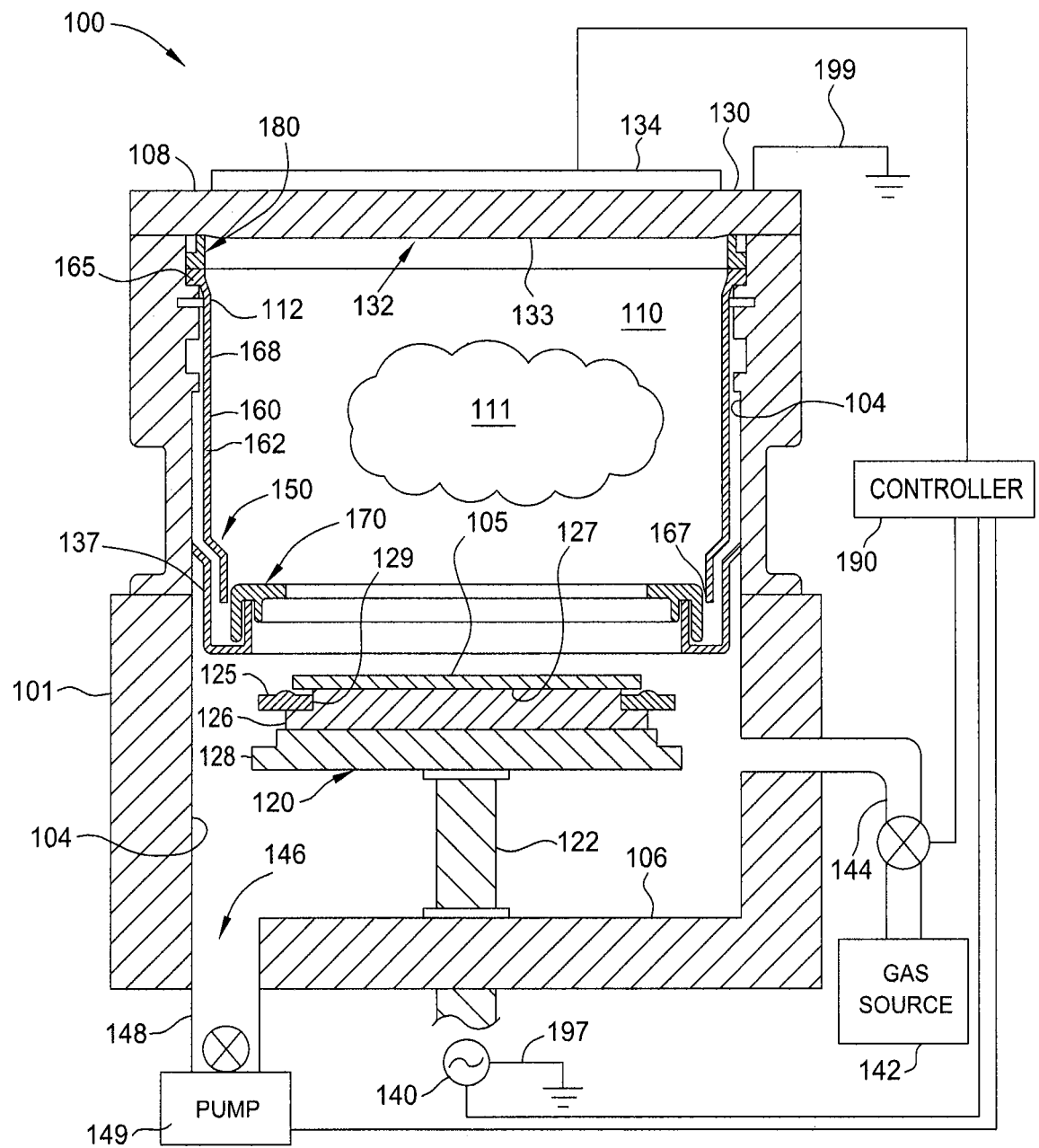
FIG. 1 is a simplified sectional view of a semiconductor processing system having an upper shield.

FIG. 1 depicts an exemplary semiconductor processing chamber 100 having an upper shield 160. The upper shield 160 may be part of a process kit 150. The process kit 150 may also include a cover ring 170, an isolator ring 180, and/or a lower shield 137. The process kit 150, or a portion thereof such as the upper shield 160, may act as a chamber anode 112 for providing a RF return path during plasma processing operations.

The processing chamber 100 may be a sputtering chamber, i.e., a physical vapor deposition (PVD) chamber, capable of depositing a film on the substrate 105. For example, the processing chamber 100 may deposit dielectric materials on the substrate 105, such as silicon oxide ($SiO_2$). It is contemplated that other deposition chambers may also be adapted to benefit from the invention.

The processing chamber 100 includes a chamber body 101 having sidewalls 104, a bottom wall 106, and a lid assembly 108 that enclose an interior volume 110. The chamber body 101 may be formed from stainless steel, aluminum or other suitable materials. The sidewalls 104 generally contain a slit valve (not shown) to provide for entry and egress of the substrate 105 from the processing chamber 100. The lid assembly 108, in cooperation with the upper shield 160, confines a plasma 111 formed in the interior volume 110 to a region above the substrate 105.

The processing chamber 100 is controlled by a controller 190 that comprises program code having instruction sets configured to control the operation of the processing chamber 100 for processing the substrates 105. For example, the controller 190 can comprise program code that includes an instruction set run a PVC process in the processing chamber 100 to deposit a layer of material on the substrate 105.

A pedestal assembly 120 is disposed in the interior volume 110 of the processing chamber 100. The pedestal assembly 120 supports a deposition ring 125 along with the substrate 105 during processing. The pedestal assembly 120 may be supported from the bottom wall 106 or sidewall 104 of the processing chamber 100. In one embodiment, the pedestal assembly 120 is coupled to the bottom wall 106 of the processing chamber 100 by a lift mechanism 122 that is configured to move the pedestal assembly 120 between upper and lower positions.

The pedestal assembly 120 generally includes a substrate support 126 sealingly coupled to a platform housing 128. The platform housing 128 may be fabricated from a metallic material such as stainless steel or aluminum. A cooling plate (not shown) may be disposed within the platform housing 128 to thermally regulate the substrate support 126. The substrate support 126 may be comprised of aluminum alloy, ceramic or other suitable materials. The substrate support 126 has a substrate receiving surface 127 that receives and supports the substrate 105 during processing. The substrate support 126 also has a peripheral edge 129 that terminates before an overhanging edge of the substrate 105. The substrate support 126 may be an electrostatic chuck, a ceramic body, a heater or a combination thereof. In one embodiment, the substrate support 126 is an electrostatic chuck that includes a dielectric body having a conductive layer embedded therein.

The lid assembly 108 generally includes a lid 130, a sputtering target 132, and a magnetron 134. The lid 130 is supported by the sidewalls 104. The sputtering target 132 is coupled to the lid 130 and exposed to the interior volume 110 of the processing chamber 100. The sputtering target 132 has a sputtering surface 133. The sputtering target 132, and in particular the sputtering surface 133, provides material which is deposited on the substrate 105 during processing. The isolator ring 180 is disposed between the sputtering target 132, lid 130, and chamber body 101 to electrically isolate the sputtering target 132 from the lid 130 and the chamber body 101. The sputtering target 132 is biased by the power source 140 relative to a common ground 199, 197 coupled to the processing chamber 100.

A process gas is supplied to the interior volume 110 from a gas source 142 via conduits 144. The gas source 142 may comprise a non-reactive gas such as argon or xenon, which is capable of energetically impinging upon and sputtering material from the sputtering surface 133 of the sputtering target 132. The gas source 142 may additionally comprise a reactive gas such as oxygen, nitrogen, hydrogen or other suitable gas for reacting with material sputtered from the sputtering target 132. Spent process gas and byproducts are exhausted from the processing chamber 100 through an exhaust port 146. The exhaust port 146 is fluidly attached to an exhaust conduit 148. The exhaust conduit 148 is connected to one or more exhaust pumps 149. The exhaust conduit 148 may have a throttle valve to control the atmospheric pressure of the interior volume 110 in the processing chamber 100.

A magnetron 134 is coupled to the lid 130 on the exterior of the processing chamber 100. The magnetron 134 is electrically coupled to a power source 140. Electrical energy from the magnetron 134 energizes the gas to form ions and maintain the plasma 111 in the interior volume 110 of the processing chamber 100. The plasma 111 is formed between the substrate 105 and the sputtering target 132. The gas ions are accelerated toward the sputtering target 132 and cause material to become dislodged from the sputtering surface 133. The dislodged material from the sputtering surface 133 is deposited on the substrate 105. Additionally, dislodged material from the sputtering surface 133 may form a film on portions of the processing kit 150, such as the upper shield 160.

The upper shield 160, and in some embodiments the lower shield 137, encircles the sputtering surface 133 of the sputtering target 132 and the peripheral edge 129 of the substrate support 126. The upper shield 160 and lower shield 137 cover the sidewalls 104 of the processing chamber 100 to reduce deposition of sputtering deposits originating from the sputtering surface 133 of the sputtering target 132 onto the sidewalls 104 and surfaces behind the upper and lower shield 160, 137. For example, the upper shield 160, in conjunction with the lower shield 137, can protect the surfaces of the substrate support 126, the overhanging edge of the substrate 105, sidewalls 104 and bottom wall 106 of the processing chamber 100. The upper shield 160 may be of unitary construction with the lower shield 137. Alternately, the upper shield 160 and lower shield 137 may be formed separately.

The upper shield 160 may comprise a cylindrical outer band 168 having a top 165 and a bottom 167. The cylindrical outer band 168 has a diameter dimensioned to encircle the sputtering surface 133 of the sputtering target 132 at the top 165 and the substrate support 126 at the bottom 167. The upper shield 160 may have exposed surfaces, for example an interior surface 162, facing the interior volume 110 in the processing chamber 100. In one embodiment, the interior surface 162 may be grit blasted to have a surface roughness such as between about 175 microinches to about 450 microinches. The surface roughness serves to promote film adhesion, i.e., reduce particle shedding, and prevent contamination within the interior volume 110 of the processing chamber 100.

The upper and lower shields 160, 137 may be electrically bonded to the processing chamber 100, i.e., ground 199, and form the chamber anode 112 for the ground return path for the plasma 111 formed in the interior volume 110. During plasma operations, the films adhering to the interior surface 162 may form an insulating layer. The upper shield 160 may have a surface texture formed thereon to prevent the film from insulating the chamber anode 112 and negatively affecting the plasma 111 causing process drift and or arcing.

Figure 2:
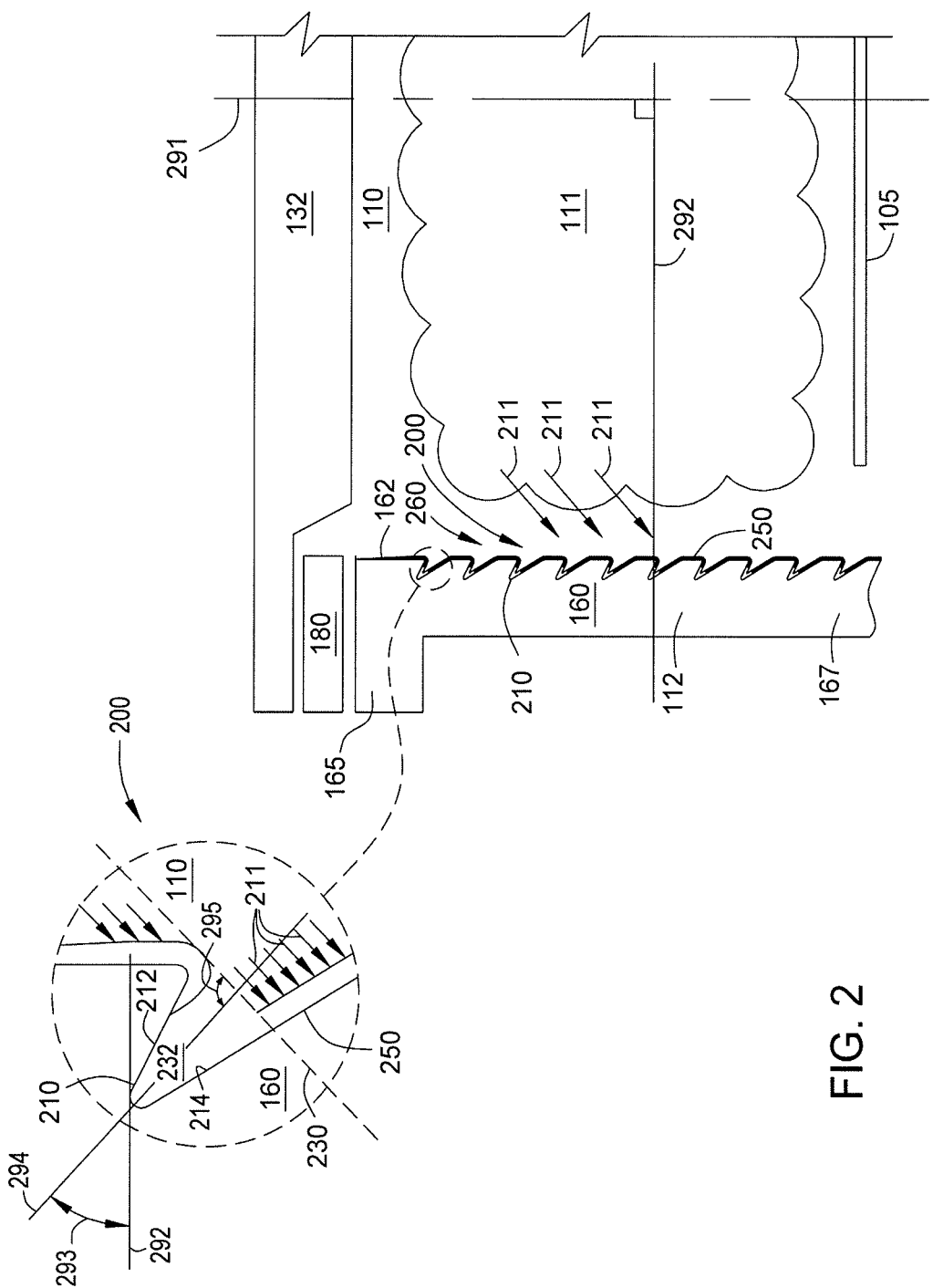
FIG. 2 is a partial sectional view of the upper shield having one embodiment of a surface texture.

FIG. 2 is a partial sectional view of the upper shield 160 having one embodiment of a surface texture 260. The surface texture 260 may be integral to the interior surface 162 of the upper shield 160, or process kit 150. It should be appreciated that the surface texture 260 may be applied to additional chamber components, such as the lower shield 137, to achieve an ultimate result for performance of the RF ground path. However, the following discussion will be in reference primarily to the upper shield 160 for the sake of simplicity. The surface texture 260 may be formed in or on the interior surface 162 by any suitable manner. For example, the surface texture 260 may be formed by imprinting, machining, burning therein, depositing thereon, adhering thereto, 3D printing or by suitable techniques. The upper shield 160 has a vertical centerline 291. The vertical centerline 291 is additionally perpendicular to the sputtering surface 133 of the target 132.

Figure 3:
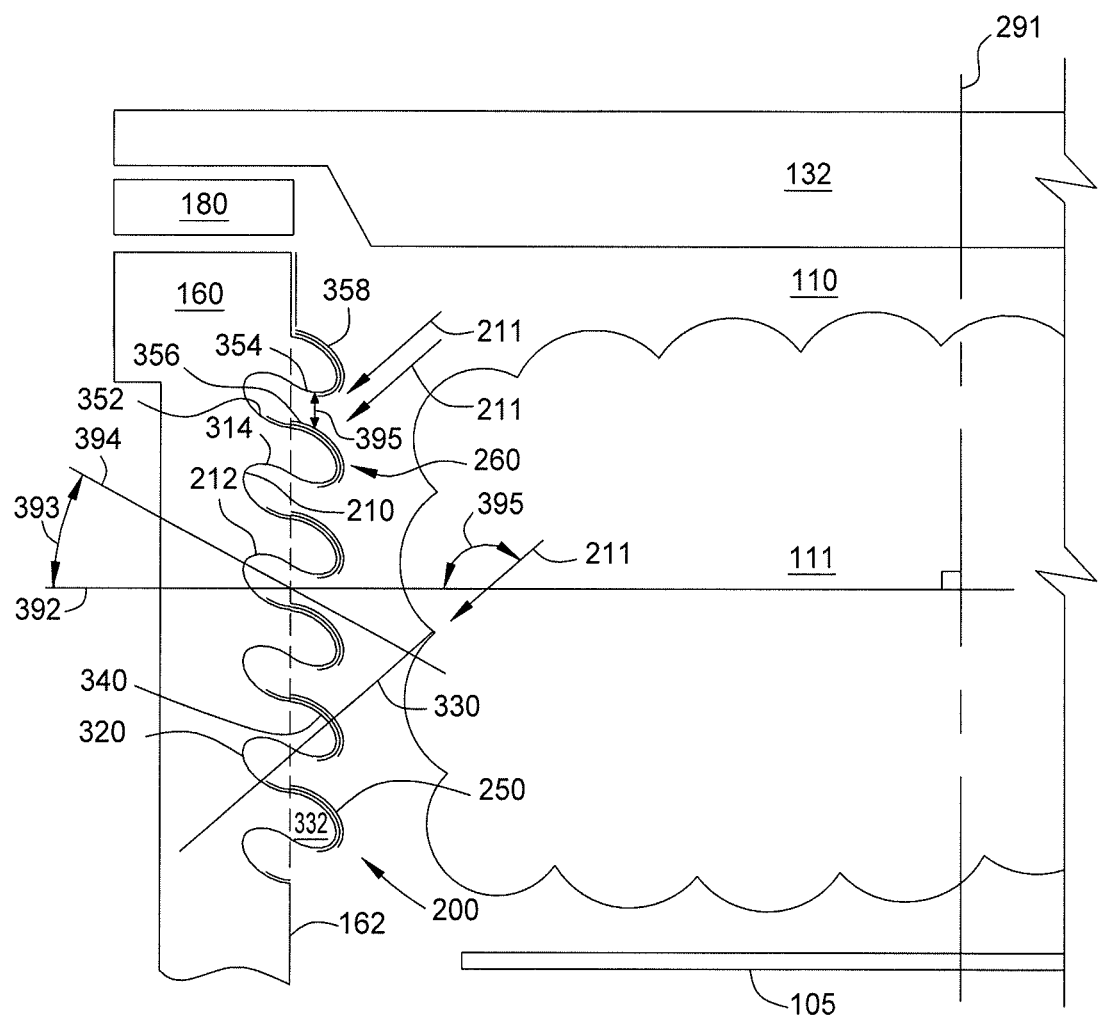
FIG. 3 is a partial sectional view of the chamber liner having another embodiment of the surface texture.

The surface texture 260 may include a plurality of features 210. The features 210 of the surface texture 260 may extend into the interior surface 162 away from the interior volume 110. For example, the surface texture 260 may include an inner surface 214. Alternately, the features 210 of the surface texture 260 may protrude from the interior surface 162 into the interior volume 110. In yet other embodiments, the features 210 may both extend into the interior surface 162 and protrude therefrom, such as illustrated in FIG. 3. In one or more embodiments, the features 210 may have a density in the surface texture 260 of between 30 per cm$^2$ and about 60 per cm$^2$, such as about 42 per cm$^2$. The features 210 in this example can also be circumferential (Grooves cut around the shield) to the upper shield 160 with a feature size such that they have a vertical density of features in between 2 per cm and 10 per cm.

Particles 211 are dislodged from the sputtering target 132. The particles 211 have a downward trajectory as illustrated by the arrows (labeled 211). The particles may form a film 250 on the interior surface 162 of the upper shield 160, i.e., the chamber anode 112. The film 250 may form on portions of the surface texture 260. A profile 200 of the feature 210 may have a centerline 294, as shown in FIG. 2, which is at an angle 293 from an imaginary line 292 that extends perpendicular from the vertical centerline 291 of the upper shield 160. The angle 293 is generally greater than 0°, such as greater than 10°, such as between about 20° and about 70° degrees. The feature 210 has shaded areas 232 which are blocked from a trajectory 230 of the particles 211 by an overhanging portion of the shield 160. The angle 293 will still shadow the great majority of the deposition from entering in the feature 210 while the greater the angle 293 will enhance the effectiveness of the shadowing. Generally, the larger or closer the angle 293 is to 90°, the larger the shaded areas 232. For example, the shaded areas 232 disposed in the inner surface 214 of the feature 210 (shown left of the trajectory line 230) are not visible, i.e., no straight line exposure, to the sputtering target 132, and thus the particles 211. The angle 293 of the feature 210 may be maintained at or near 90° to the trajectory 230 of the particles 211. Particles 211 may form films on portions of the inner surface 214. However, the particles 211 do not appreciably accumulate on the shaded areas 232 as opposed to the portion of the inner surface 214 having straight line exposure to the target 132. A large angle 293 ensures that a large portion of the feature 210 is defined by the shaded areas 232, and thus available to function as an anode after many deposition cycles as described below.

The shaded area 232 of the feature 210 has a small anode surface area 212 that remains substantially free of the film 250 due to the downward facing orientation of the feature 210. Each feature 210 has a respective small anode surface area 212 that is free of film 250. In a first embodiment, the small anode surface area 212 in each feature 210 is about 0.0005 cm$^2$. This area calculation is represented in the embodiment of FIG. 3. In a second embodiment as shown in FIG. 2, the small anode surface area 212 in each feature 210 is about 10 cm$^2$. Assuming about 10 cm$^2$ vertical area on the upper shield 160 and a feature size of about 3 mm shadowing a 1 mm ring, the second embodiment of the surface area 212 yields about 300 cm$^2$ of shadowed surface area. The number and pattern of features 210 in the surface texture 260 may be determined to provide a sufficiently quantity of small anode surface area 212 to maintain a suitable electrical pathway for the RF return path. For example, the plasma processing performance in the processing chamber 100 configured for a 200 mm substrate is enhanced by maintaining a film free surface area (area 212) for the anode of at least about 15 cm$^2$, such as between about 15 cm$^2$ and about 70 cm$^2$. (Shown in the embodiment of FIG. 3) In another example, the plasma processing performance in the processing chamber 100 configured for a 300 mm substrate is enhanced by maintaining a film free surface area (area 212) for the anode of at least about 300 cm$^2$, such as between about 300 cm$^2$ and about 600 cm$^2$. In one embodiment, the total small anode surface area 212 in all the features 210 in the processing chamber 100 is about 32 cm$^2$. Thus, the small anode surface area 212 provides an enhanced ground path for the plasma 111 long after film 250 builds up on and insulates outer portions of the anode 112, and that helps maintain process stability for quality substrate processing. The enhanced ground provided by the small anode surface area 212 prevents arcing, thus preventing the contamination of the substrate 105, along with the preventing equipment damage. Thus, the downward facing orientation of the feature 210 ensures that a significant portion of the shaded areas 232 remain deposition free and functioning as an anode, accordingly extending the service life of the film coated chamber equipment.

Alternatively, the features 210 may be circumferential grooves. The shaded area 232 in the circumferential groves may be about 1 mm wide when taken at a cross-section such as that illustrated in FIG. 2. A dozen or more of the features 210 (circumferential grooves) may be formed in the upper shield 160. Thus, the small anode surface area 212 in the upper shield 160 may be increased to yield an area of about 125 cm$^2$ or more free of the dielectric film 250.

FIG. 3 is a partial sectional view of the upper shield 160 having another embodiment of the surface texture 260. The surface texture 260 has features 210 forming an indentation 320 which extend into the interior surface 162. The surface texture 260 additionally has features 210 forming a protrusion 340 extending away from the interior surface 162. The indentations 320 and protrusions 340 may be form in a repeating pattern or array. The indentations 320 and protrusions 340 may be circular, rectangular or have any other suitable shape. The indentations 320 have an opening 395. The opening 395 exposes indentation 320 to the interior volume 110 of the processing chamber 100. The indentations 320 and protrusions 340 may additionally be a mix of shapes arranged in a manner which maximized the shaded area 232. For example, each indentation 320 may have one protrusion 340 adjacent thereto. In one embodiment, a respective one of the protrusions 340 is positioned above each indentation 320. In another embodiment, each indentation 320 is bounded by protrusions 340 such that no indentation 320 is adjacent another indentation 320. In these and other similar arrangements, the protrusions 340 may limit the line of sight to the sputtering target 132, shown by line 330, further away from the opening 395 of the indentation 320 and thus increase the size of the shaded area 232 of each indentation 320.

The profile 200 of the indentations 320 as shown in FIG. 3 may have a centerline 394 extending therethrough. The centerline 394 may form an angle 393 to an imaginary line 392 extending perpendicular from the vertical centerline 291 of the upper shield 160. The features 210 have shaded areas 232 disposed in the indentations 320 where the film 250 is substantially prevented from forming. The angle 393 may be adjusted to increase the size of the shaded area 232 within the indentations 320 by reducing the exposure of the feature 210 through an opening 395. For example, the angle 393 of the centerline 394 of the indentation 320 may be made substantially perpendicular to the projected path of the particles 211, such that the angle 393 may be between about 30° and about 60° such as 45°. In one embodiment, the angle 393 for each feature 210 is substantially similar. In another embodiment, the angle 393 for each feature 210 is increased as the distance between the feature 210 and the sputtering target 132 is increased. The straight line exposure of the shaded areas 232 in the indentations 320 may further be limited by the protrusions 340. The film 250 forms from the particles 211 adhering to the upper shield 160.

The film 250 may have a thicker area 358 in areas directly exposed to particles 211 from the sputtering target 132. The film 250 may additionally have areas of lesser thickness area 352 which may still provide a conductive pathway for grounding the plasma 111. There may be other areas of the film 250 having a thickness area 356 somewhere between the lesser thickness area 352 and thicker area 358 which provide diminished ground return path conductivity. A film free anode area 314 is present in the shaded areas 232. The arrangements and size of the indentations 320 and protrusions 340 may be configured to maximize the surface area of the anode area 314. The total area of the anode area 314 and the minimum thickness area 352 in each feature 210 of the surface texture 260 in the processing chamber 100 configured for a 200 mm substrate may be at least about 15 cm$^2$, such as between about 15 cm$^2$ and about 70 cm$^2$. Alternately, in the processing chamber 100 configured for a 300 mm substrate, the total area of the anode area 314 and the minimum thickness area 352 in each feature 210 of the surface texture 260 is at least about 30 cm$^2$, such as between about 30 cm$^2$ and about 210 cm$^2$. Thus, the arrangement of both indentations 320 and protrusions 340 at an angle, such as angle 393, may provide a better ground for controlling the plasma 111.

Figure 4:
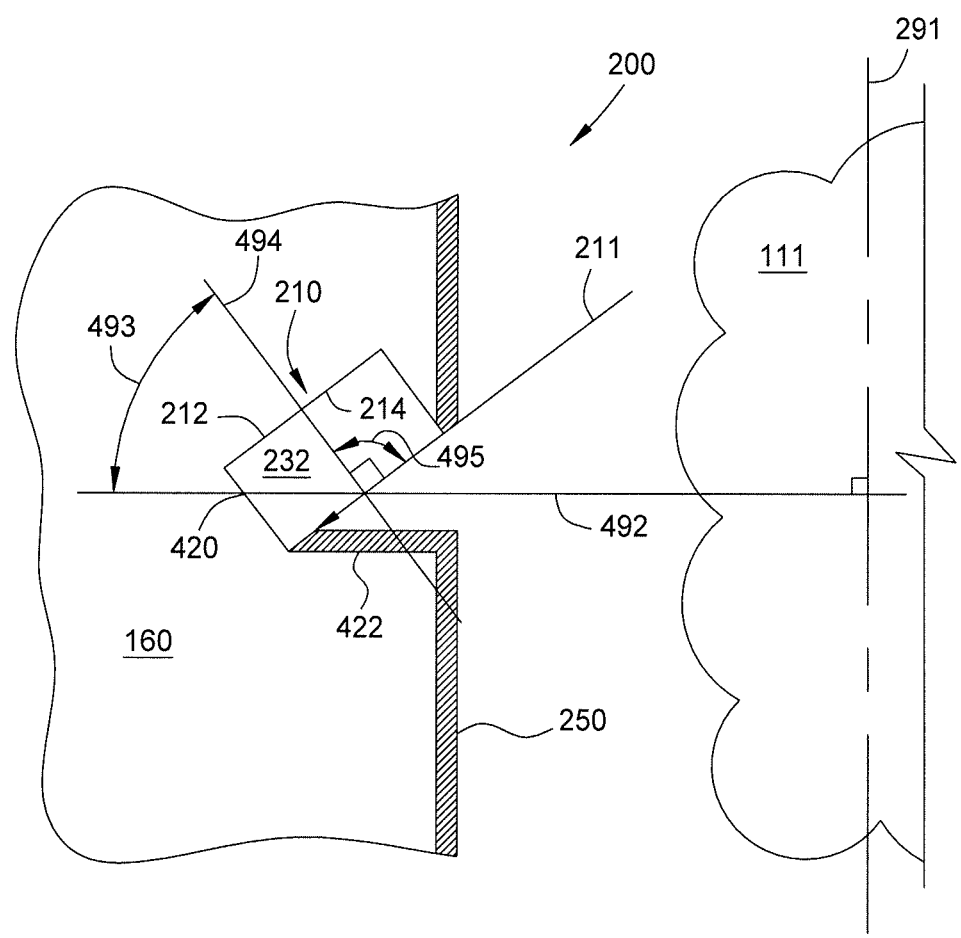
FIG. 4 is a partial sectional view for other embodiments of the surface texture.

FIG. 4 is a partial sectional view for other embodiments of the surface texture 260 having a feature 210. The feature 210 has a shape 420 which may be configured to maximize the shaded area 232. The shape 420 is shown to be rectangular but may be any shape. For example, the shape 420 of the feature 210 may be circular, hexagonal, oblong, irregular or any suitable form. The shape 420 of the feature 210 may be selected to increase or decrease the small anode surface area 212 in the shaded area 232. A centerline 494 may form an angle 493 to an imaginary line 492 extending perpendicular from the vertical centerline 291 of the upper shield 160. The centerline 494 of the feature 210 may be configured at an angle 495 to the particles 211 such that the particles 211 are minimized from entering therein. The angle 495 may be greater than zero degrees, such as greater than 10 degrees, such as between 20 degrees and 70 degrees. The rotation of the feature 210 (i.e., centerline 494) between about 20 degrees and about 70 degrees from the imaginary line 492 may result in the angle 495 between the centerline 494 of the feature 210 and the line of sight with the sputtering target 132 (shown by particles 211), is 30° or more, such as 90°. An overhang, similar to the protrusion 340 in FIG. 3, may extend downward from an upper portion 424 of the shape 420 to increase the area not having straight line exposure to the sputtering target 132. The larger the overhang, the larger the shaded area 232, thus, increasing the small anode surface area 212. The total amount of the small anode surface area 212 can therefore be selected for a predetermined ground path of the electrical circuitry. It should be appreciated that the area void of the film 250 aids in providing the grounding which controls the plasma properties and overall substrate quality.

The components of the process kit 150, having the texture 260 formed thereon and described above, work alone and in combination to significantly reduce particle generation and stray plasmas. The RF return path, i.e., ground path, contributing to RF harmonics causing stray plasma outside the process cavity, is improved by the surface texture on the anode. Thus, when dielectric films are deposited in PVD chambers, the buildup of a dielectric layer on the process kit does not impact the anode. The surface texture prevents process drift relative to an uncoated kit. Additionally, the surface texture prevents voltage discharge through arcing which will either blow a hole through the deposition somewhere on the process kit or wafer causing particles and/or wafer damage.

While the foregoing is directed to embodiments of the present invention, other and further embodiments of the invention may be devised without departing from the basic scope thereof, and the scope thereof is determined by the claims that follow.

What is claim is:

1. A process kit for a plasma processing chamber, comprising:
   a conductive cylindrical body, wherein the conductive cylindrical body is configured as a cylindrical shield, the conductive cylindrical body having an internal surface and an external surface, the conductive cylindrical body having orientation when the conductive cylindrical body is in use in the plasma processing chamber that defines a top of the conductive cylindrical body and a vertical centerline, the top of the conductive cylindrical body configured to be supported by the plasma processing chamber and extending radially from the vertical centerline, the conductive cylindrical body having an array of features formed within the internal surface of the conductive cylindrical body that is exposed to a plasma when in use in the plasma processing chamber, each feature within the array of features is defined by:
   a protrusion extending beyond the internal surface,
   an opening formed in the internal surface of the cylindrical body: and
   an indentation extending away from the opening into the conductive cylindrical body toward the external surface, the indentation exposing an inner surface of the conductive cylindrical body the indentation having a geometric centerline extending through the opening equidistant from the inner surface, the geometric centerline extending away from the top of the conductive cylindrical body through the opening toward the vertical centerline and the geometric centerline forming an obtuse angle with the vertical centerline of the conductive cylindrical body, wherein each feature has an orientation of the geometric centerline and is oriented toward a bottom of the conductive cylindrical body.

2. The process kit of claim 1, wherein each protrusion of each feature further comprises:
   an overhanging portion defined on a side of the opening closest the top of the cylindrical conductive body.

3. The process kit of claim 1, wherein the internal surface of the conductive cylindrical body is textured.

4. The process kit of claim 1, wherein the internal surface of the conductive cylindrical body has a grit blasted texture.

5. The process kit of claim 4, wherein the grit blasted texture has a surface roughness between about 175 microinches to about 450 microinches.

6. A process kit for a RF physical vapor deposition (RFPVD) chamber, comprising:
   a conductive cylindrical body, wherein the conductive cylindrical body is configured as a cylindrical shield, the conductive cylindrical body having an internal surface and an external surface, the conductive cylindrical body having orientation when the process kit is in use in the RFPVD chamber that defines a top of the conductive cylindrical body and a vertical centerline, the top of the conductive cylindrical body configured to be supported by the RFPVD chamber and extending radially from the vertical centerline, the conductive cylindrical body having an array of features formed in a substantially vertical surface of the conductive cylindrical body that is exposed to a plasma when the process kit in use in the RFPVD chamber, each feature within the array of features is defined by:
   a protrusion extending beyond the internal surface,
   an opening formed in the internal surface of the conductive cylindrical body: and
   an indentation extending away from the opening into the conductive cylindrical body toward the external surface, the indentation exposing an inner surface of the conductive cylindrical body, the indentation having a geometric centerline extending through the opening equidistant from the inner surface, the geometric centerline extending away from the top of the conductive cylindrical body through the opening toward the vertical centerline and the geometric centerline forming an obtuse angle with the vertical centerline of the conductive cylindrical body, wherein each feature has an orientation of the geometric centerline and is oriented toward a bottom of the conductive cylindrical body.

7. The process kit of claim 6, wherein the indentation of each feature further comprises:
   a shadowed area having an configuration that prevents straight line exposure to a sputtering target when the process kit is in use in the RFPVD chamber.

8. The process kit of claim 6, a vertical surface defines an inner cylindrical sidewall of the conductive cylindrical body.

9. The process kit of claim 6, wherein the internal surface of the conductive cylindrical body is textured.

10. The process kit of claim 6, wherein the internal surface of the conductive cylindrical body has a grit blasted texture.

11. The process kit of claim 10, wherein the grit blasted texture has a surface roughness between about 175 microinches to about 450 microinches.

12. A physical vapor deposition (PVD) chamber, comprising:
   a chamber body defining in interior volume;
   a substrate support disposed in the interior volume;
   a sputtering target disposed in the interior volume above the substrate support; and
   a process kit disposed in the interior volume between the substrate support and sputtering target, the process kit comprising:
   a conductive cylindrical body, wherein the conductive cylindrical body is configured as a cylindrical shield, the conductive cylindrical body having an internal surface and an external surface, and a vertical centerline, the conductive cylindrical body having an array of features formed in a surface of the conductive cylindrical body that is exposed to a plasma when in use in the PVD chamber, each feature within the array of features is defined by:
a protrusion extending beyond the internal surface,
an opening formed in the internal surface of the conductive cylindrical body: and
an indentation extending away from the opening into the conductive cylindrical body toward the external surface, the indentation exposing an inner surface of the conductive cylindrical body, the indentation having a geometric centerline extending through the opening equidistant from the inner surface, the geometric centerline extending away from the target through the opening toward the vertical centerline and the geometric centerline, the geometric centerline forming an obtuse angle with the vertical centerline of the conductive cylindrical body, wherein each feature has an orientation of the geometric centerline and is oriented toward a bottom of the conductive cylindrical body, a top of the conductive cylindrical body configured to be supported by the PVD chamber and extending radially from the vertical centerline.

13. The PVD chamber of claim 12, wherein each protrusion limits a line of sight to a sputtering target; and a shaded area formed within the indentation beneath the protrusion.

14. The process kit of claim 1, further comprising:
a dielectric film overlaying the protrusion, and wherein a shaded area within the indentation is free of the dielectric film.

15. The process kit of claim 14, wherein a total area of an anode area and a minimum thickness area in each feature of a surface texture in the plasma processing chamber configured for a 200 mm substrate is between about 15 cm$^2$ and about 70 cm$^2$, or a total area of an anode area and a minimum thickness area in each feature of a surface texture in the plasma processing chamber configured for a 300 mm substrate is between about 30 cm$^2$ and about 210 cm$^2$.

16. The process kit of claim 14, further comprising:
a sputtering target disposed above the conductive cylindrical body.

17. The process kit of claim 16, wherein the sputtering target coupled to an RF power source.

18. The process kit of claim 6, further comprising:
a sputtering target disposed above the conductive cylindrical body.

* * * * *